(12) United States Patent
Mattei et al.

(10) Patent No.: US 6,879,490 B2
(45) Date of Patent: Apr. 12, 2005

(54) INCREMENTALLY-ADJUSTABLE WIRING TRAY AND HINGED WIRING TRAY COVER

(75) Inventors: Michael Mattei, Saint James, NY (US); Robert P. Auteri, Manorville, NY (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 90 days.

(21) Appl. No.: 10/339,080

(22) Filed: Jan. 9, 2003

(65) Prior Publication Data

US 2003/0128530 A1 Jul. 10, 2003

Related U.S. Application Data

(60) Provisional application No. 60/347,143, filed on Jan. 9, 2002.

(51) Int. Cl.[7] ................................................. H05K 7/16
(52) U.S. Cl. ........................ 361/727; 361/726; 361/747
(58) Field of Search ......................... 361/759, 801–803, 361/683, 724, 725, 726, 727, 747, 752, 753, 756

(56) References Cited

U.S. PATENT DOCUMENTS

| 496,739 | A | * | 5/1893 | Kennedy ..................... 254/100 |
| 3,613,606 | A | * | 10/1971 | Grow et al. ........... 108/158.11 |
| 4,172,677 | A | * | 10/1979 | Gunti ......................... 403/189 |
| 4,684,097 | A | * | 8/1987 | Cox ......................... 248/354.3 |
| 4,941,841 | A | * | 7/1990 | Darden et al. .............. 361/685 |
| 5,105,756 | A | * | 4/1992 | Bell ............................ 114/363 |
| 5,442,513 | A | * | 8/1995 | Lo ............................. 361/685 |
| 5,563,767 | A | * | 10/1996 | Chen ......................... 361/685 |
| 5,587,854 | A | * | 12/1996 | Sato et al. ............... 360/97.01 |
| 5,694,290 | A | * | 12/1997 | Chang ........................ 361/685 |
| 5,767,445 | A | * | 6/1998 | Wu ........................... 174/52.1 |
| 6,466,439 | B2 | * | 10/2002 | Liu ............................ 361/687 |
| 6,506,973 | B1 | * | 1/2003 | Howard et al. ............... 174/48 |

* cited by examiner

*Primary Examiner*—Amir Zarabian
*Assistant Examiner*—Thanh Y. Tran
(74) *Attorney, Agent, or Firm*—George C. Rondeau, Jr.; Davis Wright Tremaine LLP

(57) ABSTRACT

An incrementally adjustable wiring tray assembly, including a channel section having a predetermined length for approximating a required length of a wiring tray run, the channel section including an inwardly-formed flange having first spaced-apart connection means positioned thereon. A connecting section is provided for fitting in a telescoping relation with the channel section. The connecting section includes an inwardly-formed flange having second spaced-apart connectors positioned thereon adapted for mating cooperation with the first connectors for securing the channel section and the connecting section together at a length where the collective length of the channel section and a non-telescoped portion of the connecting section define the required length of the wiring tray run.

14 Claims, 4 Drawing Sheets

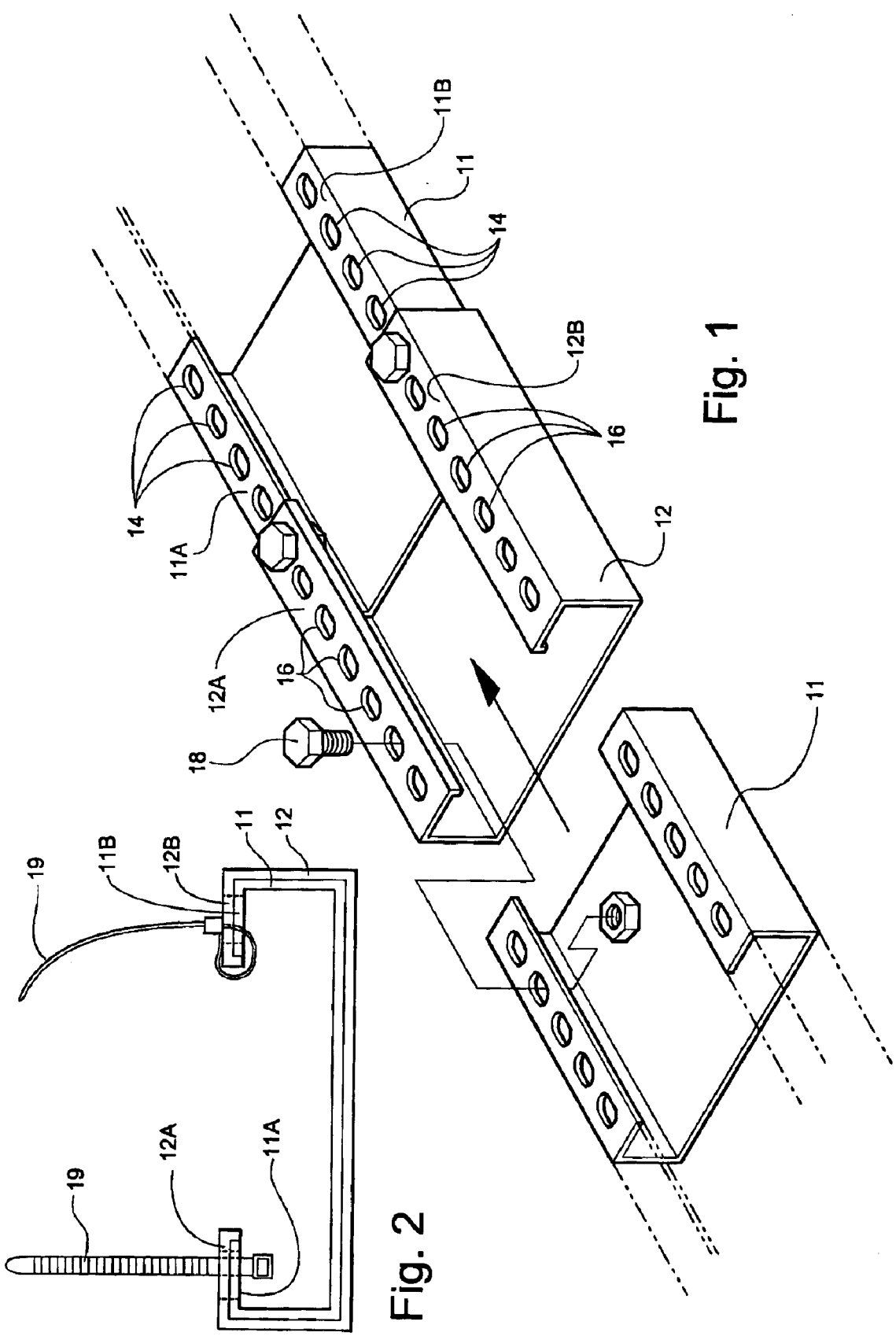

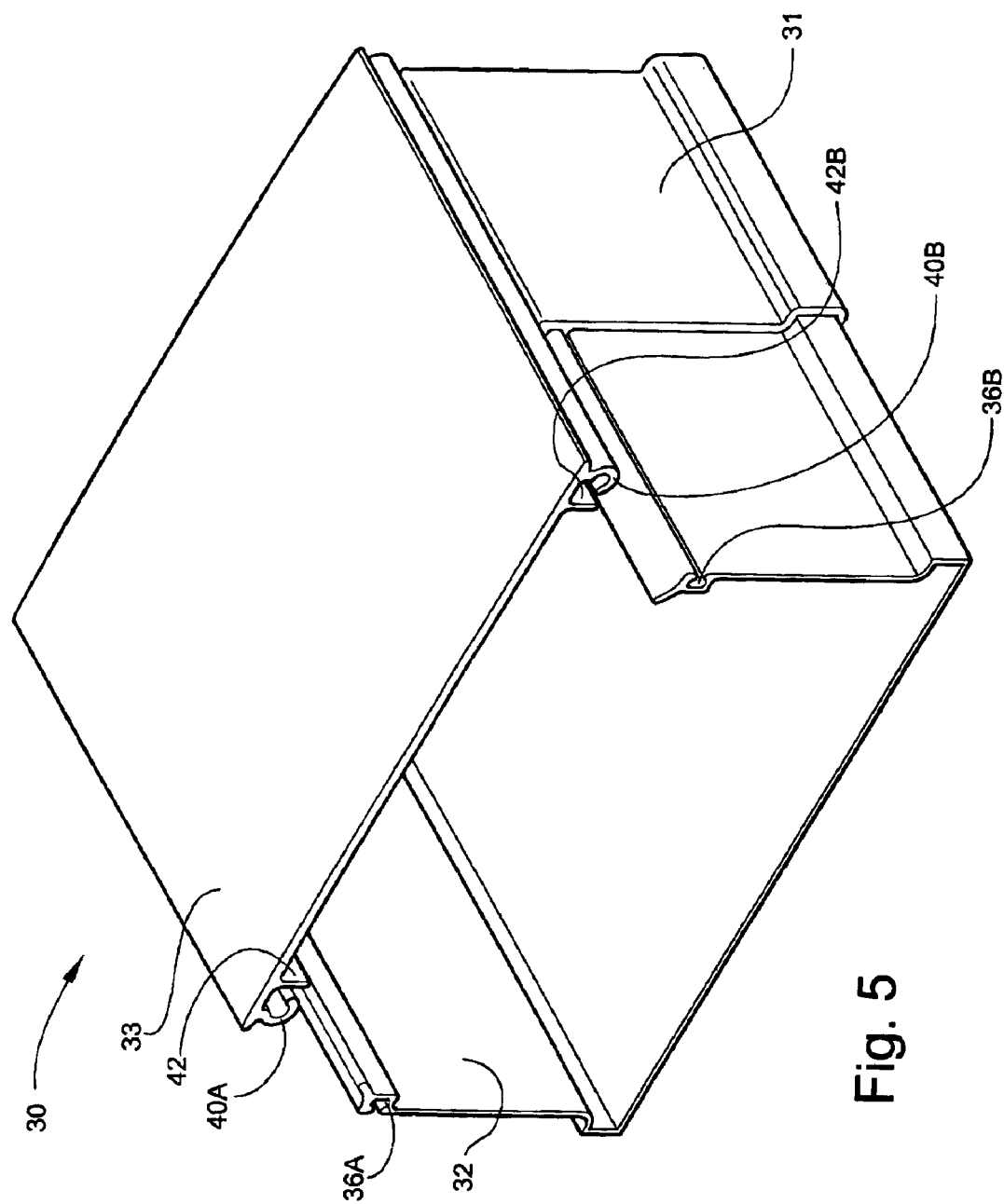

INCREMENTALLY-ADJUSTABLE WIRING TRAY AND HINGED WIRING TRAY COVER

TECHNICAL FIELD AND BACKGROUND OF THE INVENTION

This invention relates to an incrementally-adjustable wiring tray of the type used to contain and protect electrical cabling such as metal wiring or optical glass fiber communication cable. Wiring tray elements are ordinarily sold in incremental lengths. It is the responsibility of the installer to determine the length of the run and select the necessary elements that, collectively, make up the correct length. This often requires shortening one or more tray elements by cutting, and when the required run length is greater than the longest available length, telescoping or otherwise fastening two tray elements together to form a wiring tray of the correct length.

This invention permits predetermined lengths of tray elements to be joined to a very high degree of precision without cutting to make up a wiring tray having a correct length.

SUMMARY OF THE INVENTION

Therefore, it is an object of the invention to provide wiring tray assembly elements that can be quickly assembled without cutting to form a wiring tray assembly having the correct length.

It is another object of the invention to provide a wiring tray assembly that can be assembled form standard elements.

It is another object of the invention to provide a wiring tray assembly that has a high degree of adjustability.

It is another object of the invention to provide a wiring tray assembly that has connectors that releasably secure tray elements together positively.

It is another object of the invention to provide a wiring tray assembly that includes a cover that encloses the tray elements.

It is another object of the invention to provide a wiring tray assembly that includes a tray that pivots open from either side of the wiring tray.

These and other objects of the present invention are achieved in the preferred embodiments disclosed below by providing an incrementally adjustable wiring tray assembly, comprising a channel section having a predetermined length for approximating a required length of a wiring tray run, the channel section including an inwardly-formed flange having first spaced-apart connection means positioned thereon. A connecting section is provided for fitting in a telescoping relation with the channel section. The connecting section includes an inwardly-formed flange having second spaced-apart connection means positioned thereon adapted for mating cooperation with the first connection means for securing the channel section and the connecting section together at a length where the collective length of the channel section and a non-telescoped portion of the connecting section define the required length of the wiring tray run.

According to one preferred embodiment of the invention, the first and second connecting means comprise adjustment holes in the flanges for being aligned and for receiving therethrough a fastening member for maintaining the holes in alignment.

According to another preferred embodiment of the invention, the fastening means are selected from the group consisting of wire ties, screws and rivets.

According to yet another preferred embodiment of the invention, the connecting section is dimensioned to telescope within the channel section.

According to yet another preferred embodiment of the invention, an incrementally adjustable wiring tray assembly, is provided, and comprising first and second channel sections having a collective predetermined length for approximating a required length of a wiring tray run, the first and second channel sections each including opposed, inwardly-formed flanges formed on an upper end of a pair of sidewalls and having first spaced-apart connection means positioned thereon. A connecting section is provided for fitting in a telescoping relation between the first and second channel sections, the connecting section including opposed, inwardly-formed flanges formed on an upper end of a pair of sidewalls and having second spaced-apart connection means positioned thereon adapted for mating cooperation with the first connection means for securing the first channel section adjacent a first end of the connecting section and the second channel section adjacent a second end of the connecting section at a collective length where the collective length of the first and second channel sections and a non-telescoped portion of the connecting section define the required length of the wiring tray run.

According to yet another preferred embodiment of the invention, the first connecting means and the second connecting means comprise one or the other of pairs of flanges and slots adapted to adjustably fit together.

According to yet another preferred embodiment of the invention, the first connecting means comprise the flanges and the second connecting means comprise the slots.

According to yet another preferred embodiment of the invention, a cover is provided for being positioned over an open top of the channel section and the connecting section.

According to yet another preferred embodiment of the invention, a top edge of the opposed sidewalls of the channel section and a top edge of the opposed sidewalls of the connecting section each include an outwardly directed channel section retainer. The cover includes a mating, inwardly directed cover retainer adapted for being press-fitted over the channel section retainer and the connecting section retainer to retain the cover on the wiring tray assembly.

According to yet another preferred embodiment of the invention, the channel section retainer and the connecting section retainer includes mating curved surfaces for allowing the cover to be pivoted open by removing the cover retainer from one side of the channel section and connecting section and rotating the cover upwardly about the other side of the channel section and connection section.

BRIEF DESCRIPTION OF THE DRAWINGS

Some of the objects of the invention have been set forth above. Other objects and advantages of the invention will appear as the description proceeds when taken in conjunction with the following drawings, in which:

FIG. 1 is a fragmentary perspective view of a wiring tray channel section and connecting section;

FIG. 2 is a vertical cross-section of an overlapping section of the channel section and connecting section;

FIG. 5 is a perspective view of the wiring tray shown in FIG. 4.

DESCRIPTION OF THE PREFERRED EMBODIMENT AND BEST MODE

Figure 3:
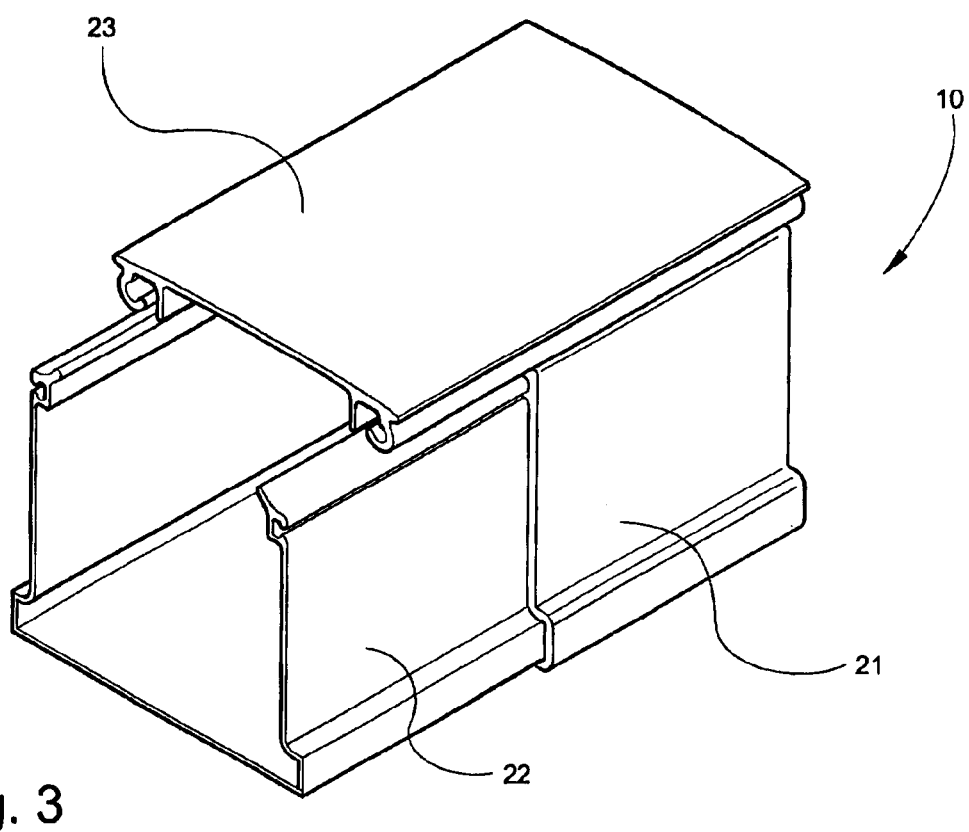
FIG. 3 is a perspective view of a wiring tray according to another embodiment of the invention, and including a snap-on hinging cover.

Referring now specifically to the drawings, a wiring tray assembly according to one embodiment of the present invention is illustrated in FIG. 1 and shown generally at reference numeral 10. The wiring tray assembly 10 is comprised of two types of tray elements, a channel section 11 and a connecting section 12. As is shown in FIG. 1, the connecting section 12 is used to connect together two channel sections 11. In use, the channel sections 11 are relatively long and are supplied in a given length. The exact length needed ordinarily will not be an exact multiple of the length of the channel sections, so one or more connecting sections 12 are used to provide the exact length required. This is done by telescoping the connecting section 12 with one, or between two, channel sections 11.

The channel sections have opposed, inwardly-facing flanges 11A, 11B with a plurality of adjustment holes 14. Similarly, the connecting channel 12 has opposed inwardly-facing flanges 12A, 12B with a plurality of adjustment holes 16 that are spaced to align with holes 14 on the channel section 11 as desired to provide a wiring tray of the required length. Fasteners such as machine screws 18, FIG. 1, or plastic wire ties 19 or rivets (plastic or metallic), FIG. 2, are then passed through the aligned holes to maintain the proper length. The resulting wiring tray assembly 10 can be supported in any conventional manner from the top, side or bottom. This design allows a high degree of adjustability while insuring a positive, mechanical attachment at the correct length.

Another embodiment according to the invention is shown in FIG. 3. In this embodiment, a wiring tray assembly 20 is comprised of a channel section 21 and a connecting section 22 telescoped within the channel section 21. A cover 23 is shown in position over the top opening of the telescoped channel section 21 and connecting section 22. The wiring tray assembly 20 has a 4×4 inch capacity. The enlarged ribs at the bottom of the channel section 21 and the connecting section 22 provide increased rigidity and mechanical strength to the assembly.

Figure 4:
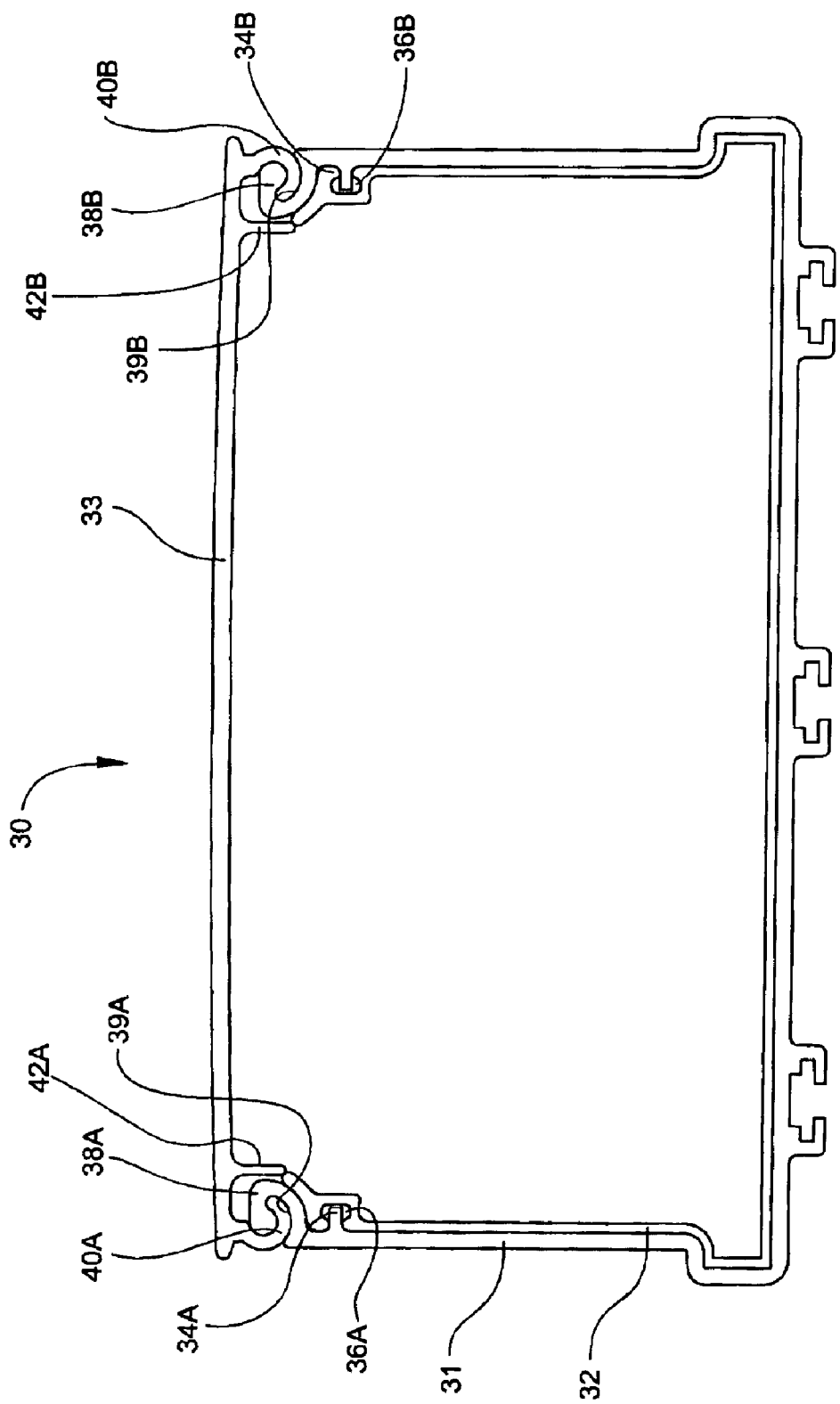
FIG. 4 is a vertical cross-section of an embodiment of a wiring tray showing the snap-on hinging cover.

As is shown in FIGS. 4 and 5, a 4×8 inch capacity wiring assembly 30 is shown. The basic structure and function is identical to the function and structure of the wiring assembly 20 shown in FIG. 4 except for the larger capacity of the wiring assembly 30, and it will be understood therefore that the following description applies equally to both the wiring assemblies 20 and 30.

The wiring assembly 30 includes a channel section 31, a connecting section 32 and a cover 33. The connecting section 32 telescopes into the channel section 31 and the two elements are held in registration with each other by inwardly-extending flanges 34A and 34B that fit into complementary slots 36A, 36B.

The cover 33 is designed to snap onto the top of the channel section 31. This is accomplished by providing lips 38A, 38B which define respective curved recesses 39A, 39B. The cover 33 includes a pair of inwardly and downwardly curved hinges 40A, 40B which extend along the length of the cover 33. The hinges 40A, 40B serve two functions.

First, the hinges 40A, 40B are spaced to provide an interference fit with the lips 38A, 38B of the channel section 31. The cover 33 is snapped onto the top of the channel section 31 by positioning the cover 33 on top of the channel section 31 and pressing downwardly with sufficient force to spread the hinges 40A, 40B. The hinges 40A, 40B ride along the outer surface of the lips 38A, 38B until they snap over the lips 38A, 38B and slide into the slots 39A, 39B.

Second, the cover 33 may be pivoted upwardly from either side to gain access to the interior of the channel section 31. This is accomplished by, for example, pulling upwardly on the hinge 40A and removing it from the slot 39A. As this happens, the hinge 40B pivots clockwise and extends further into the slot 39B, allowing the cover 33 to pivot clockwise while remaining secured to the channel section 31.

If access is desired from the other side, this is accomplished by pulling upwardly on the hinge 40B and removing it from the slot 39B. As this happens, the hinge pivots counterclockwise and extends further into the slot 39A, allowing the cover 33 to pivot counterclockwise while remaining secured to the channel section 31.

The cover 33 also includes a pair of downwardly-extending ribs 42A, 42B which engage the top edge of the connecting section 32. This position provides additional rigidity and strength to the cover 33 and a more precise fit of the cover 33 onto the channel section 31.

A wiring tray assembly is described above. Various details of the invention may be changed without departing from its scope. Furthermore, the foregoing description of the preferred embodiment of the invention and the best mode for practicing the invention are provided for the purpose of illustration only and not for the purpose of limitation—the invention being defined by the claims.

We claim:

1. An incrementally adjustable wiring tray assembly, comprising:
    (a) a channel section having a predetermined length for approximating a required length of a wiring tray run, the channel section including first spaced-apart connection means;
    (b) a connecting section for fitting in a telescoping relation with the channel section, the connecting section including second spaced-apart connection means, the second spaced-apart connection means being adapted for mating cooperation with the first spaced-apart connection means for securing the channel section and the connecting section together at a length where the collective length of the channel section and a non-telescoped portion of the connecting section define the required length of the wiring tray run; and
    (c) a cover for being positioned over an open top of the channel section and connecting section, wherein the cover is pivoted open by removing the cover from one side of the channel section and connecting section and rotating the cover upwardly about the other side of the channel section and connecting section.

2. An incrementally adjustable wiring tray assembly according to claim 1, wherein said first and second spaced-apart connecting means comprise adjustment holes for being aligned and for receiving therethrough a fastening member for maintaining the holes in alignment.

3. An incrementally adjustable wiring tray assembly according to claim 2, wherein the fastening members are selected from the group consisting of wire ties, screws and rivets.

4. An incrementally adjustable wiring tray assembly according to claim 1, wherein the connecting section is dimensioned to telescope within the channel section.

5. An incrementally adjustable wiring tray assembly according to claim 1, wherein the first spaced-apart connecting means and the second spaced-apart connecting means comprise one or the other of pairs of flanges and slots adapted to adjustably fit together.

6. An incrementally adjustable wiring tray assembly according to claim 5, wherein the first spaced-apart connecting means comprise the flanges and the second spaced-apart connecting means comprise the slots.

7. An incrementally adjustable wiring tray assembly according to claim 1, wherein a top edge of opposed sidewalls of the channel section and a top edge of opposed sidewalls of the connecting section each include an outwardly directed channel section retainer, and the cover includes a mating, inwardly directed cover retainer adapted for being press-fitted over the channel section retainer and the connecting section retainer to retain the cover on the wiring tray assembly.

8. An incrementally adjustable wiring tray assembly according to claim 7, wherein the channel section retainer and the connecting section retainer include mating curved surfaces for allowing the cover to be pivoted open.

9. An incrementally adjustable wiring tray assembly, comprising:
   (a) first and second channel sections having a collective predetermined length for approximating a required length of a wiring tray run, the first and second channel sections each including opposed, inwardly-formed flanges formed on an upper end of a pair of sidewalls;
   (b) a connecting section for fitting in a telescoping relation between the first and second channel sections, the connecting section including opposed, slots formed on an upper end of a pair of sidewalls, the inwardly-formed flanges and slots being adapted for mating cooperation for securing the first channel section adjacent a first end of the connecting section and the second channel section adjacent a second end of the connecting section at a collective length where the collective length of the first and second channel sections and a non-telescoped portion of the connecting section define the required length of the wiring tray run, and
   (c) a cover for being positioned over an open top of the first and second channel sections and connecting section, wherein the cover is pivoted open by removing the cover from one side of the first and second channel sections and connecting section and rotating the cover upwardly about the other side of the first and second channel sections and connecting section.

10. An incrementally adjustable wiring tray assembly according to claim 9, wherein a top edge of the opposed sidewalls of the channel section and a top edge of the opposed sidewalls of the connecting section each include an outwardly directed channel section retainer, and the cover includes a mating, inwardly directed cover retainer adapted for being press-fitted over the channel section retainer and the connecting section retainer to retain the cover on the wiring tray assembly.

11. An incrementally adjustable wiring tray assembly according to claim 10, wherein the channel section retainer and the connecting section retainer include mating curved surfaces for allowing the cover to be pivoted open.

12. An incrementally adjustable wiring tray assembly, comprising:
   (a) a connecting section having a predetermined length for approximating a required length of a wiring tray run, the channel section including opposed, inwardly-extending flanges;
   (b) a connecting section for fitting in a telescoping relation with the channel section, the connecting section including opposed slots, the inwardly-extending flanges and slots being adapted to adjustably fit together for securing the channel section and the connecting section together at a length where the collective length of the channel section and a non-telescoped portion of the connecting section define the required length of the wiring tray run; and
   (c) a cover for being positioned over an open lop of the channel section and connecting section, wherein the cover is pivoted open by removing an inwardly directed cover retainer from one side of the channel section and connecting section and rotating the cover upwardly about the other side of the channel section and connecting section.

13. An incrementally adjustable wiring tray assembly according to claim 12, wherein a top edge of opposed sidewalls of the channel section and a top edge of opposed sidewalls of the connecting section each include an outwardly directed channel section retainer, and wherein the inwardly directed cover retainer is adapted for being press-fitted over the channel section retainer and the connecting section retainer to retain the cover on the wiring tray assembly.

14. An incrementally adjustable wiring tray assembly according to claim 12, wherein the channel section retainer and the connecting section retainer include mating curved surfaces for allowing the cover to be pivoted open.

\* \* \* \* \*